United States Patent [19]

Schierz

[11] 3,854,198

[45] Dec. 17, 1974

[54] SEMICONDUCTOR ARRANGEMENT AND METHOD OF PRODUCTION

[75] Inventor: Winfried Schierz, Roth, Germany

[73] Assignee: Semikon Gesellschaft fur Gleichrichterbau und Elektronik m.b.H., Nurnberg, Germany

[22] Filed: July 2, 1973

[21] Appl. No.: 375,535

Related U.S. Application Data

[60] Continuation of Ser. No. 109,831, Jan. 26, 1971, abandoned, which is a division of Ser. No. 8,996, Feb. 5, 1970.

[30] Foreign Application Priority Data

Apr. 1, 1969 Germany .......................... 1916554

[52] U.S. Cl. .................................... 29/588, 29/591

[51] Int. Cl. ............................................ B01j 17/00

[58] Field of Search .......... 29/576 S, 577, 588, 628, 29/630 G, 591; 174/DIG. 3; 317/234 N

[56] References Cited

UNITED STATES PATENTS

| | | | |
|---|---|---|---|
| 3,270,399 | 9/1966 | Ohntrup | 29/576 S |
| 3,569,797 | 3/1971 | Simmons | 29/576 S |
| 3,702,954 | 11/1972 | Mosch | 317/234 N |

*Primary Examiner*—Roy Lake
*Assistant Examiner*—W. C. Tupman
*Attorney, Agent, or Firm*—Spencer & Kaye

[57] ABSTRACT

A semiconductor arrangement having semiconductor rectifier wafers arranged in a plane and contacted between portions of associated conductors forming a clamp-type mounting. All of the conductor portions for the semiconductor arrangement, including the clamp-type mounting, are formed from a single band of planar conductive material to which the conductors remain connected during the manufacturing process. The clamp-type mountings for the semiconductor wafers are formed by bending one of a pair of adjacent associated conductor portions out of the plane of the conductors and displacing it parallelly so that it overlaps the other of the pair of conductors. After insertion of the semiconductor wafers within the clamp-type mountings and any further processing required, the portion of the conductors containing the clamp-type mountings and the wafers are encapsulated, and the conductors are severed from the band of material to produce a plurality of individual devices. The basic technique may be utilized and is particularly advantageous for rectifier arrangements using a plurality of rectifying devices, for example, single-phase and three-phase bridge circuits and three-phase star circuits.

8 Claims, 9 Drawing Figures

INVENTOR
Winfried Schierz

BY Spencer & Kaye
ATTORNEYS.

INVENTOR
Winfried Schierz

BY Spencer & Kaye
ATTORNEYS.

INVENTOR
Winfried Schierz

BY Spencer & Kaye
ATTORNEYS.

SEMICONDUCTOR ARRANGEMENT AND METHOD OF PRODUCTION

CROSS REFERENCE TO RELATED APPLICATION

This application is a continuation of application Ser. No. 109,831, filed Jan. 26th, 1971, and now abandoned which itself is a division of application Ser. No. 8,996, filed Feb. 5th, 1970.

BACKGROUND OF THE INVENTION

With the constant increase in the number of application possibilities for semiconductor arrangements the use of semiconductor rectifier arrangements of low output current becomes increasingly significant. Additionally for many types of applications more and more economical embodiments having smaller dimensions and possibly the same or improved electrical characteristics than have heretofore been available are required.

In the semiconductor rectifier arrangements of the known type, the semiconductor wafer is contacted in a conventional manner at one of its prepared surfaces with a metallic supporting element and at the other of its surfaces with at least one suitably constructed connecting lead and disposed in a housing.

In the German Published Patent application DAS 1,095,951 there is disclosed a process for manufacturing semiconductor rectifier arrangements wherein one surface of a thin, strip-shaped semiconductor body is permanently connected with the ends of all of the bars of a comb-shaped metallic supporting element which is provided with a solderable coating. After the application of further electrodes on the opposite free surface side of the semiconductor body, the semiconductor body and the supporting element, between the bars thereof, are divided at suitable places to form a plurality of devices.

The German Published Patent application DAS 1,246,888 further discloses a process for manufacturing semiconductor arrangements for small current outputs in which prefabricated, possibly metallized, strip-shaped conductor portions which overlap at right angles are first placed one on top of the other and thereafter two or more semiconductor wafers are inserted therebetween at the cross-over points in the appropriate electrical polarization. The wafers are then simultaneously connected to the conductor portions by means of a heat treatment to form the desired rectifier circuit.

It has also been proposed to provide a semiconductor arrangement, which is intended to make possible the simultaneous and economical fabrication of a large number of semiconductor devices wherein at least one semiconductor wafer is inserted between the suitable constructed ends of a clasp-type metallic conductor whose ends are associated to one another in a predetermined manner. The semiconductor arrangement, consisting of the semiconductor wafer and the conductor arms which serve as the connecting leads, is then disposed in a housing.

Various drawbacks are, however, exhibited by the known semiconductor arrangements. In many of these techniques, the semiconductor arrangements are produced one at a time. Individually produced items are, in general, expensive to manufacture and thus, generally uneconomical. Additionally, for semiconductor arrangements containing a plurality of semiconductor wafers, the known techniques generally require that the wafers be inserted with different orientations, thus resulting in additional expenses. Moreover, the assembly of the desired circuits in the known techniques is often complicated, and thus also expensive, and utilizes configurations of elements which results in the operating behavior of the devices not meeting the desired requirements for special applications.

SUMMARY OF THE INVENTION

The semiconductor arrangements according to the present invention eliminate the above-mentioned drawbacks while maintaining the advantages of the known arrangements. Moreover, due to their advantageous construction and surprisingly simple manner of fabrication, they lend themselves to a particularly economical mass-production technique which allows special consideration for embodiments having two or more semiconductor elements arranged in a desired electrical circuit.

The present invention overcomes the above-mentioned drawbacks by providing a semiconductor arrangement having semiconductor rectifier elements the wafers of which are arranged in a row in one plane, and are contacted between the sections of associated conductor portions which form a clamp-type mounting. According to the invention a plurality of conductors are produced or formed in any desired number from a possibly continuous, band of planar conductive material. Each of the conductors is connected at one end thereof, to a longitudinally extending portion or zone of the conductive material which serves as a transporting strip. The conductors form a planar, geometrical structure or pattern which periodically repeats itself along the length of the band. One of the pair of adjacent planar conductor portions associated with each semiconductor wafer is bent out of the plane of the band of material and offset in parallel and arranged to overlap the other of the pair of adjacent conductor portions to form therewith a clamp-type mounting for the semiconductor wafer. The center lines of the ends of the conductors which are connected to the transporting strip, and which serve as the leads external to the housing in the completed device, serve as markings for separting the geometric conductor structure into desired rectifier circuits and/or individual semiconductor elements.

According to another aspect, the present invention relates to an advantageous process for manufacturing such semiconductor arrangements in which semiconductor wafers are contacted on both sides with conductor portions and are encapsulated in a housing. According to the process of the invention, a plurality of periodically repeating geometrically patterned structures of conductors are produced from a band of planar conductor material with each of the structures being connected to a longitudinally extending portion of the band which serves as a transporting strip. The structures of conductors may be formed simultaneously or sequentially in a sequence determined by markings on the transport strip, with one complete structure of conductors being formed over at least one full period. The clamptype mountings for the semiconductor wafers are than formed by bending one of a pair of adjacent conductor portions associated with a semiconductor wafer out of the plane of the band, displaced parallelly and disposed to overlap the other of the pair of adjacent conductors. Semiconductor wafers are then inserted, with the proper electrical orientation, between the thus associated conductor portions of each of the clamp-type mountings. Preferably the conductor patterns are formed so that the wafers may be inserted with the same electrical orientation. Any further conventional processing steps, such as contacting, etching, cleaning, surface treatment and encapsulation are then performed simultaneously for all of the structures connected to the transport strip, that finally the completed semiconductor devices and/or rectifier arrangements are separated from the common transporting strip.

Figure 1:
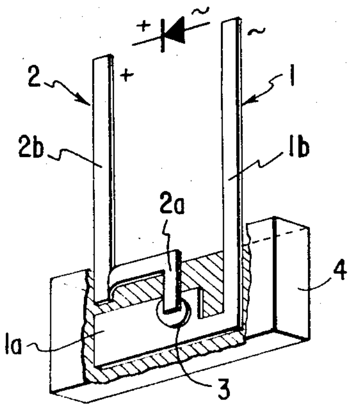
FIG. 1 is a perspective, greatly enlarged view of a completed semiconductor device according to the present invention with a portion of the housing cut away.

FIGS. *6a* to *6h* illustrate various steps in the process of manufacturing a semiconductor device as shown in FIG. 1 according to the invention.

Figure 7:
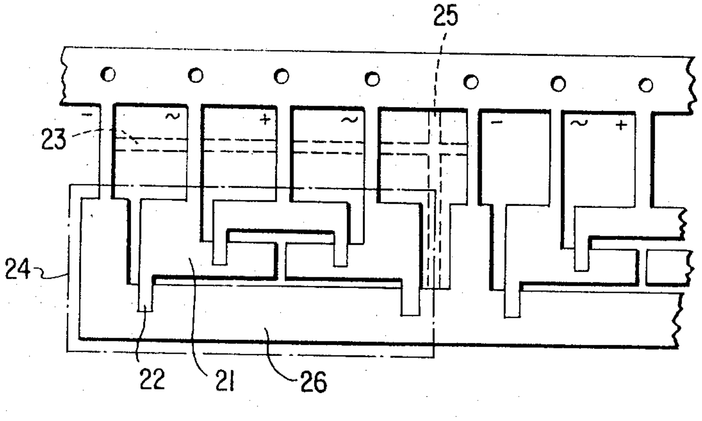

FIG. 7 is a plan view of a conductor pattern constructed according to the invention showing an alternative embodiment for a single-phase bridge rectifier circuit.

Figure 8:
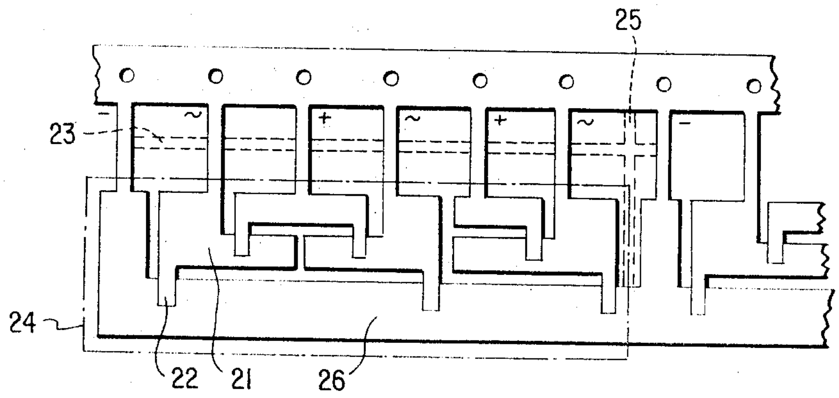

FIG. 8 is a plan view of a conductor pattern, constructed according to the invention, for a three-phase bridge rectifier circuit.

Figure 9:
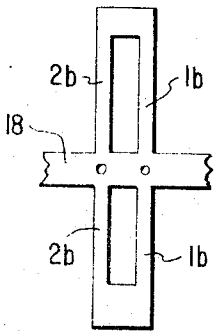

FIG. 9 is a plan view of a conductor pattern illustrating a modification of FIG. *6a* whereby the patterns extend from opposite edges of a central strip.

DESCRIPTION OF THE PREFERRED EMBODIMENTS

Referring now to FIG. 1, there is shown a semiconductor rectifier device constructed according to the invention which comprises essentially a pair of conductors 1 and 2 which have been formed from a single sheet of planar conductive material, a semiconductor wafer 3 connected between the conductors 1 and 2, and a housing surrounding a portion of the conductors 1 and 2 and the wafer 3. Conductor sections *1a* and *2a*, which represent the portions of the conductors 1 and 2 within the housing 4, form, respectively, the supporting or lower contact element and the upper contact element for a clamp-type mounting for the semiconductor wafer 3. In order to form the clamp-type mounting from the conductor sections *1a* and *2a*, which are constructed with rectangular surface areas and initially arranged with their surface areas interlocking, i.e., the conductor section *2a* initially extends into the recess *1c* formed in the conductor section *1a*, the conductor section *2a* is suitably bent, at a right angle, out of the plane of the conductor *1a* and parallelly offset so that it overlaps the supporting element or conductor section *1a*.

The conductor sections *1b* and *2b* which extend outside of the housing 4 serve as the current leads for connection to the external circuitry. These conductor sections *1b* and *2b* are parallel to one another and may be suitably constructed for use of the semiconductor device in circuit boards and to this end may be provided with a predetermined mutual spacing which corresponds to a desired grid pattern or spacing on the boards. The supporting element *1a*, as shown, is constructed so that is has a large or optimum areal expanse which is advantageous both from the viewpoint of ease in construction and fabrication and from an operational point of view.

The material required for the formation of the conductor portions 1 and 2 consist of a band of planar conductive material which exhibits good electrical and thermal conductivity as well as good deformability and a certain spring hardness. Such a material is preferably copper, brass, iron or an iron-nickel-cobalt alloy. The material thickness depends on the fabrication process for the conductor portions and on the current load capacity of the arrangement. When the conductors where produced by means of an etching process, copper plates of 0.2 to 0.5 mm thickness brought about favorable results. For solder contacting, the conductor portions 1 and 2 are preferably provided at least at the intended contact locations, with a suitable metallization coating, such as tin or stanniferous alloys. The housing 4 is formed from an insulating material which is sprayed or cast around the desired portion of the semiconductor device.

Figure 2:
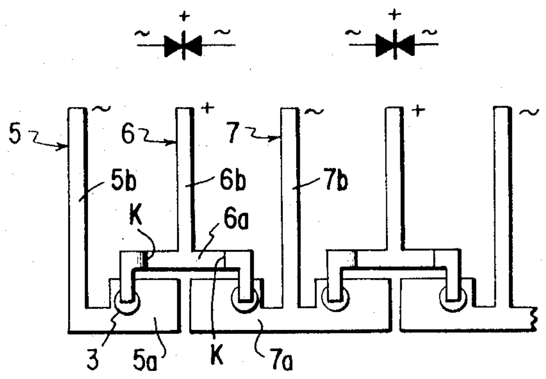
FIG. 2 is a plan view of two semiconductor devices, without housings, constructed according to the invention, with each device containing two diodes having their positive conductors connected together.

The arrangement formed of conductor portions 1 and 2 and semiconductor wafer 3 is advantageously suited as a basic structural element for semiconductor arrangements having two or more semiconductor wafers. Due to the polarity resulting from the operation at the leads of the arrangements as illustrated in FIG. 1 and by the conventional circuit symbol for rectifier circuits, various possible combinations of the basic concept of the present invention can easily be realized. Thus, FIG. 2 shows a semiconductor arrangement in center connection which was produced by joining two systems according to FIG. 1 in one plane and in an association forming a mirror image with respect to the plus or positive conductor 2 of FIG. 1 to produce a circuit having two rectifiers with their positive conductors connected. Two of such circuits according to the present invention are illustrated. The central conductor portion 6, which serves as the positive connection has a strip-shaped section *6a* which will be within the housing in the completed device. The conductor section *6a* is provided with a pair of right angle bends, for example, at points K, and coordinated to the conductor portions *5a* and *7a* analogous to that shown in FIG. 1. Except for the bent protrusions of section *6a*, all of the remaining portions of the conductors are disposed in a single plane and form a structure with relatively large cooling surfaces. Thus, by providing an appropriate housing configuration, the prerequisite of a satisfactory device that has favorable thermal operating behavior is easily fulfilled. Conductor sections *5b*, *6b* and *7b* extend from their respective portions to serve as leads for external connections.

With respect to the dimensions and mutual spacings of the conductor portions for the embodiments illustrated in FIG. 2 and the following figures, the comments made with respect thereto in connection with FIG. 1 are applicable.

Figure 3:
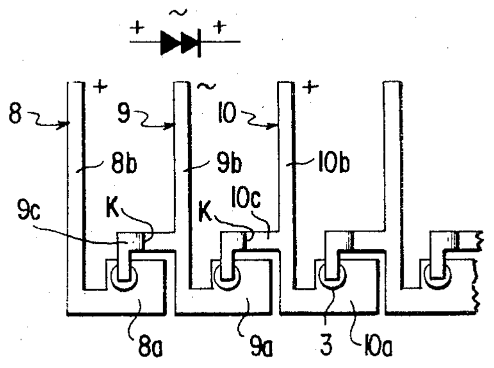
FIG. 3 is a plan view of semiconductor devices without a housing, constructed according to the invention showing two diodes connected in series in a half single-phase bridge rectifier circuit.

FIG. 3 shows a semiconductor arrangement for a half of a single-phase bridge circuit realized by an analogous application of the principle of the present invention. The alternating current connection required between the two semiconductor wafers for spatial and electrical reasons is formed by conductor portion 9 having a bar-shaped, rectangularly constructed portion 9*c*, which acts as the upper contact piece for the semiconductor wafer supported by the lower contact element 8*a* of the negative polarity conductor 8, and its large-area portion 9*a* having a notch-shaped recess and serving as the supporting element for the semiconductor wafer connected to the portion 10*c* of the positive polarity connection 10. It should be noted that the conductor arrangement shown in FIG. 3 is in reality merely a plurality of the structures of FIG. 1 and by splitting the conductor portion 9 along the longitudinal axis of its section 9*b*, two devices according to FIG. 1, which are completely identical in construction as well as arrangement, will result, and in one plane joint together. Conductive sections 8*b* and 10*b* serve as contact leads for their respective portions.

Figure 4:
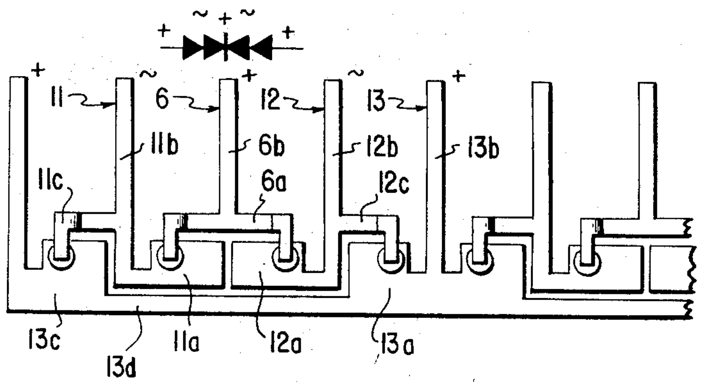
FIG. 4 is a plan view of a bridge semiconductor rectifier circuit constructed according to the invention without a housing.

If a conductor arrangement which is a mirror image of the arrangement of FIG. 3 is connected to the conductor portion 10, and if both of the positive conductors, i.e. conductor 10 and its mirror image, are combined into a single positive conductor, such as conductor 6 in FIG. 2, a periodically repeating geometrical pattern of conductors will result which represents a single-phase bridge circuit according to FIG. 4. Preferably, as indicated, the two separated minus or negative conductors are formed into a single conductor portion 13 by the base bar 13*d* formed along the edge of the structure between supporting element 13*a* and supporting element 13*c*. The resulting structure produces an embodiment which fully meets the operating and structural requirement of the users of such devices and in which the arrangement of the direct and alternating current connections (6 and 13 or 11 and 12, respectively), through their respective leads 6*b*, —*b*, 11*b* and 12*b* provide no difficulties in so far as the construction of the circuitry is concerned.

The above discribed embodiment provides a particularly favorable embodiment of the structure according to the present invention in that the structure consists of a base or wafer support conductor portion which extends longitudinally along the edge of conductive material opposite the zone longitudinal edge zone thereof forming the transporting strip, and which is designed to determine the periodicity of the desired structure, and two second conductor portions which are disposed symmetrically to a third conductor portion which is located in the center of the period of the structural pattern.

By combining the embodiments of FIGS. 3 and 4 so that the conductor portion 8 of FIG. 3 directly follows conductor portion 13 of FIG. 4 and that both are suitably connected to form an appropriately adapted minus connection, a surprisingly simple three-phase bridge circuit will result. Such a structure is shown in slightly modified form in FIG. 8.

Figure 5:
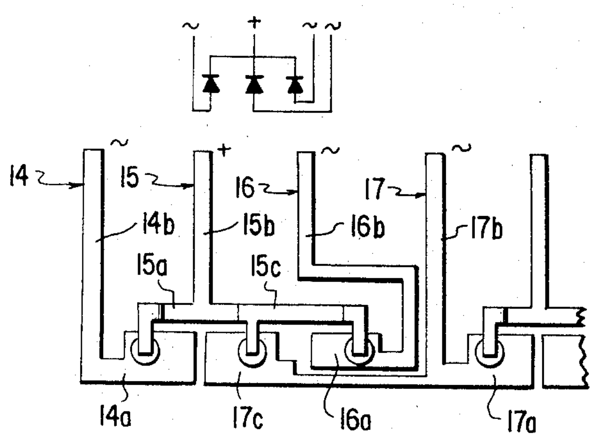
FIG. 5 is a plan view of a three-phase star connected semiconductor rectifier circuit constructed according to the invention with a housing.

FIG. 5 illustrates the application of the principle of the present invention to the formation of a three-phase star circuit. Starting with the structural arrangement of conductors for a center point connection as shown in FIG. 2, and with the parallel displacement of all the upper contact pieces for contacting three semiconductor wafers, a conductor portion 17, which constitutes the third a.c.connection, is provided so that its lower support section 17*c* is located between the sections 14*a* and 16*a*, and its section 17*b* which will extend outside the housing in the finished device is parallel to the conductor portions 14*b* and 16*b*. In order to produce a structure suitable for use in circuit boards, the conductor portion 15*b* is arranged assymetrically with respect to the portions 15*a* and 15*c* and the section of conductor portion 16*b* which will be outside the housing is arranged as shown in order that the spacing between the conductor portions 14*b*–17*b* is uniform.

Another embodiment of a circuit according to FIG. 5 can be realized with suitable orientation and arrangement of the semiconductor wafers by providing a common, large-area, stripshaped positive connection, corresponding in shape to conductor portion 1 in FIG. 1, which is arranged as a continuous supporting element, and three conductor portions serving as a.c. connections arranged in a row and in the same manner as conductor portion 2 of FIG. 1. In this way, semiconductor arrangements can be realized for six or 12 pulse rectifier circuits Turning now to the process of manufacturing the devices described above, FIGS. 6*a* to 6*h* show the devices or structures realized in the different process steps while manufacturing semiconductor devices as shown in FIG. 1.

Figure 6:
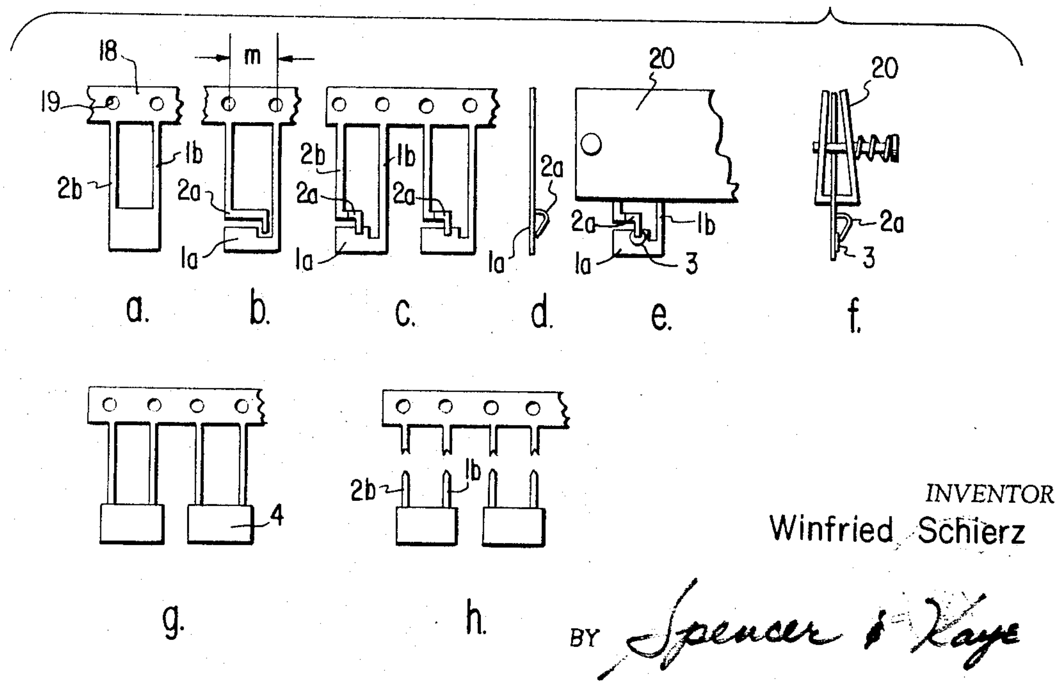

As shown in FIG. 6*a* a band of planar band conductor material, with dimensions determined by the fabrication process, the current load capability of the desired semiconductor arrangements, and by desired conductor portion dimensions is divided, preferably by cutting or punching, into a series of preliminary structures as shown with bars 1*b* and 2*b* intended as the conductive leads. A longitudinal strip 18 of the original band of material remains available and serves as a transporting strip for the plurality of conductor structures to facilitate further processing thereof. The strip may be provided, if desired, with perforations 19 which serve as indexing or reference marks to enable rapid indexing of the devices, either manually or automatically whereby more economical mass production fabrication techniques may be utilized. The perforation distribution m (FIG. 6*b*) may coincide with the spacing of the conductor sections 1*b* and 2*b* and may correspond, for example, to the grid pattern of circuit boards or a multiple thereof.

By means of cutting or directed etching in a known manner, as shown in FIG. 6*b*, conductor sections 1*a* and 2*a* are formed within the preliminary structure of FIG. 6*a*. The conductor sections 1*a* and 2*a* together with the conductor portions 1*b* and 2*b* represent a plane, geometric conductor portion structure, which although not shown in FIG. 6*b* periodically repeats itself along the length of the strip 18.

Thereafter, as shown in FIGS. 6*c* and 6*d* in plan and side views respectively, each conductor section 2*a* is suitably bent out of the plane of the strip of material 18 and by parallel displacement is positioned so that it overlaps the adjacent portion of conductor section 1*a*, thus forming a clamp-type mounting to hold a semiconductor wafer. The metallic strip fabricated in this manner and provided with a number of geometrical conductor portion structures is then mounted, as shown in FIGS. 6*e* and 6*f* in a device 20 and is supplied at each clamp preferably from the free longitudinal side of sections 1*a* with a semiconductor wafer 3 having a predetermined preferably always identical, electrical orientation. This is accomplished by depressing conductor portion 1a to insert the wafer. The spacing *m* of perforations 19 can here again be used to establish a suitable process timing in the event automatic insertion methods are utilized. By suitably clamping the conductor portion structure into the device 20 it is possible, if required, to increase the spring action of the clamp-type mountings holding the semiconductor wafers.

It should be noted that although the method has been disclosed as encompassing a plurality of sequential steps, that the disclosed order of the steps is not always required. For example, if required, the outer contour of the preliminary structures shown in FIG. 6b may also be produced after the process step which provides the formation of the clamp-type mounting.

The arrangement of a metallic strip with conductor portion structures according to the present invention in the device 20 permits the process steps required after insertion of the wafers, i.e. contacting the semiconductor wafers with their conductive leads as well as etching, cleaning and surface treatment of the semiconductor surfaces, to be performed simultaneously by immersion, in an advantageous manner for a large number of items.

There is the further possibility to arrange conductor portion structures on both sides of the perforated strip 18 and to thus provide further efficiency in the manufacturing process. Such a structure corresponding to the production step of FIG. 6a is shown in FIG. 9.

Subsequent to the different process steps for manufacturing a larger number of unencapsulated semiconductor devices, the devices which are still connected with the perforated strip 18 by means of their conductive leads, are embedded in housing 4 of insulating material (FIG. 6*g*) by any suitable means such as pressing or encasing by spraying or casting. The conductor portions 1*b* and 2*b* are then capped at the desired length and are separated form strip 18 (FIG. 6*h*). The free conductor portion ends can here be simultaneously formed to serve as soldering tips. The dimensions of housing 4 are determined by the manufacturing process as well as by the requirements for the intended purpose of the devices. If necessary, the housing may be made very thin walled at its broadsides, to assure optimum dissipation of the power loss heat.

The process steps explained with the illustrations in FIGS. 6*a* to 6*h* apply in the same manner also for the embodiments of the present invention shown in FIGS. 2 to 5 and 7 to 8.

FIGS. 7 and 8 show embodiments of conductor pattern structures according to the invention which are advantageous as concerns production methods. The arrangements illustrated in FIGS. 7 and 8 form a single-phase bridge circuit and a threephase bridge circuit respectively and are provided with largearea, inner conductor portions 21 whose sections 22 serve as the upper contact piece for one semiconductor wafer each and by suitable bending out of the plane of the conductors, form clamptype mountings with the base or supporting bar 26 for holding the semiconductor wafers. By suitably designing section 22 there is assured a sufficient mounting surface for the semiconductor wafer and thus the desired operating behavior for the arrangements.

With respect to dimensions and configuration of the conductor portions as well as to their fabrication the comments made in connection with FIGS. 1 and 6*a* to 6*h* apply here respectively. The auxiliary bar 23 shown by the broken lines as well as the auxiliary bar 25 may serve to increase the clamping effect required for holding the semiconductor wafers. Both bars are separated at the suitable time. The extent of encapsulation of the illustrated embodiment according to FIGS. 7 and 8 is indicated by the reference numeral 24.

It is to be understood that the present invention is not limited to the listed embodiments. The conductor portions may also have other shapes and/or arrangements with the prerequisite that the conductor portions are provided with areal configurations disposed in a single plane and that by bending at least one of the two adjacent conductor portions intended for contacting a semiconductor wafer at a right angle they form a clamp-type mounting for the semiconductor wafer. Additionally partial arrangements of the illustrated embodiments are suited for rectifier circuits employing less than four semiconductor wafers when the conductor portions are suitably constructed.

In summary, the advantages of the semiconductor arrangement according to the present invention and the method for fabricating them are that all of the strip-shaped conductor portions which lie in one plane are all formed out of a band of planar conductor material, e.g. by cutting; that they form, with suitable configuration and suitable mutual association, the clamp-type mounting for at least one semiconductor wafer and simultaneously represent, in this arrangement, a structural component for forming semiconductor arrangements having a plurality of semiconductor wafers in the desired electrical connection; and that the conductor portion of the band-shaped material may be produced in pairs, if required, in a larger number and in an economical working rhythm and assure in a line-up determined by the manufacturing process the economical sequence of process steps for contacting, cleaning, stabilizing and encapsulating semiconductor wafers.

It will be understood that the above description of the present invention is susceptible to various modifications, changes and adaptations, and the same are intended to be comprehended within the meaning and range of equivalents of the appended claims.

I claim:

1. A method of manufacturing semiconductor arrangements wherein semiconductor diode wafers are arranged in a plane and contacted between portions of associated conductors comprising the steps of:

producing, from a band of planar conductive material, a plurality of periodically repeating planar geometrically patterned structures of conductors each of which is connected to a longitudinally extending portion of said band of conductive material which serves as a transport strip;

forming a plurality of clamp-type semiconductor wafer mountings within said structures by bending one of a pair of adjacent conductors so as to raise a portion thereof out of the plane of said structure and displace said portion parallel to said plane and laterally in a direction parallel to the longitudinally extending portion so that said portion substantially maintains its original orientation with respect to said band of conductive material and overlaps the other of said pair of adjacent conductors, where the overlapping portions extend perpendicularly to the longitudinally extending portion, each of the bent conductors having a first section which is attached to said longitudinally extending portion of said band and extends perpendicularly therefrom, a second section which is attached to said first section and extends parallel to said longitudinally extending portion, and a third section which is attached at the end of the second section and extends perpendicular thereto, said third section forming the overlapping portion;

inserting a semiconductor wafer with the proper electrical orientation between the overlapping conductors of each of said clamp-type mountings;

simultaneously processing all of said planar structures to provide a plurality of encapsulated semiconductor devices which are connected to said transport strip by means of portions of said conductors; and separating each of said semiconductor devices from said transport strip.

2. The method of claim 1 wherein said structures of conductors are produced by cutting the surface of said band to remove the unwanted portions thereof.

3. The method of claim 1 wherein said structures are produced by selectively masking the surface of said band and then etching the unmasked portions.

4. The method of claim 1 wherein said structures of conductors are formed along opposed edges of said transporting strip.

5. The method of claim 1 wherein the patterns of said geometrical structures are formed so that the semiconductor wafers may all be inserted into the clamp-type mountings with the same orientation.

6. The method of claim 1 wherein the second section is attached at the end of the first section.

7. The method of claim 1 further comprising: interconnecting selected ones of said conductors which are to have the same polarity applied thereto by a continuous bar of material which extends parallel to said longitudinally extending section and is overlapped by a portion of at least one of the bent conductors.

8. The method of claim 1 wherein said step of forming includes bending said second section along a line perpendicular to said transporting strip.

* * * * *